US010233536B2

(12) United States Patent
Nakamura et al.

(10) Patent No.: US 10,233,536 B2
(45) Date of Patent: Mar. 19, 2019

(54) SPUTTERING APPARATUS AND METHOD OF DISCRIMINATING STATE THEREOF

(71) Applicant: ULVAC, INC., Kanagawa (JP)

(72) Inventors: Shinya Nakamura, Kanagawa (JP); Yoshinori Fujii, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 43 days.

(21) Appl. No.: 15/507,920

(22) PCT Filed: Jun. 10, 2016

(86) PCT No.: PCT/JP2016/002814
§ 371 (c)(1),
(2) Date: Mar. 1, 2017

(87) PCT Pub. No.: WO2017/029771
PCT Pub. Date: Feb. 23, 2017

(65) Prior Publication Data
US 2017/0283940 A1 Oct. 5, 2017

(30) Foreign Application Priority Data
Aug. 20, 2015 (JP) ................................. 2015-162484

(51) Int. Cl.
C23C 14/34 (2006.01)
C23C 14/08 (2006.01)
(Continued)

(52) U.S. Cl.
CPC ............ *C23C 14/34* (2013.01); *C23C 14/081* (2013.01); *C23C 14/35* (2013.01); *C23C 14/52* (2013.01);
(Continued)

(58) Field of Classification Search
CPC ....... C23C 14/34; C23C 14/081; C23C 14/52; C23C 14/35
See application file for complete search history.

(56) References Cited

U.S. PATENT DOCUMENTS 6,139,697 A * 10/2000 Chen ................. H01L 21/76877
204/192.15
2012/0152736 A1* 6/2012 Yamaguchi ......... C23C 14/0063
204/298.07
2015/0294845 A1 10/2015 Shimane et al.

FOREIGN PATENT DOCUMENTS

JP 2002-004042 A 1/2002
JP 2012-132064 A 7/2012
(Continued)

OTHER PUBLICATIONS

International Search Report and Written Opinion from PCT Patent App. No. PCT/JP2016/002814 (dated Jul. 12, 2016) with English translation of the ISR.
(Continued)

Primary Examiner — Dah-Wei D. Yuan
Assistant Examiner — Kristen A Dagenais-Englehart
(74) Attorney, Agent, or Firm — Cermak Nakajima & McGowan LLP; Tomoko Nakajima

(57) ABSTRACT

A method of discriminating a state of a sputtering apparatus in which, by sputtering a target, a film is formed on a substrate disposed to lie opposite to the target, the discrimination being made, prior to the film formation on the substrate, as to whether an atmosphere in the vacuum chamber is in a state fit for film formation. As the sputtering apparatus, use is made of one provided inside the vacuum chamber with an isolated space which is isolated from the vacuum chamber by an isolating means (6, 71~73), the isolated space being for the target and the substrate to lie therein opposite to each other, the sputtering apparatus being
(Continued)

so arranged that the isolated space is evacuated accompanied by the evacuation in the vacuum chamber. The vacuum chamber is evacuated to a predetermined set pressure and a gas is introduced therein in this state.

5 Claims, 2 Drawing Sheets

(51) Int. Cl.
| | |
|---|---|
| *C23C 14/35* | (2006.01) |
| *C23C 14/52* | (2006.01) |
| *C23C 14/54* | (2006.01) |
| *H01J 37/32* | (2006.01) |
| *H01J 37/34* | (2006.01) |
| *G01L 13/00* | (2006.01) |

(52) U.S. Cl.
CPC ........ *C23C 14/54* (2013.01); *H01J 37/32798* (2013.01); *H01J 37/32816* (2013.01); *H01J 37/34* (2013.01); *G01L 13/00* (2013.01)

(56) References Cited

FOREIGN PATENT DOCUMENTS

| | | |
|---|---|---|
| JP | 2013-019028 A | 1/2013 |
| JP | 2014-148703 A | 8/2014 |
| WO | WO2014/103168 A1 | 7/2014 |

OTHER PUBLICATIONS

International Preliminary Report on Patentability for PCT Patent App. No. PCT/JP2016/002814 (dated Mar. 1, 2018).

* cited by examiner

SPUTTERING APPARATUS AND METHOD OF DISCRIMINATING STATE THEREOF

This application is a national phase entry under 35 U.S.C. § 371 of PCT Patent Application No. PCT/JP2016/002814, filed on Jun. 10, 2016, which claims priority under 35 U.S.C. § 119 to Japanese Patent Application No. 2015-162484, filed Aug. 20, 2015, both of which are incorporated by reference.

TECHNICAL FIELD

The present invention relates to a sputtering apparatus and a method of discriminating a state thereof.

BACKGROUND ART

Conventionally, in case an insulating material, e.g., of aluminum oxide (alumina), silicon nitride, and the like is formed into targets and sputter them so as to form an insulating film of oxides, nitrides and the like on that surface of a substrate to be processed which lies opposite to the target, it is known to use a sputtering apparatus (for example, see Patent Document 1).

This kind of sputtering apparatus is provided with: a vacuum chamber in which a target is detachably mounted in position; a stage which holds a substrate so that the substrate lies opposite to the target in the vacuum chamber; an isolating means for defining an isolated space in which the target and the substrate lie opposite to each other and which is isolated from an inside of the vacuum chamber; and an evacuating means which evacuates the inside of the vacuum chamber. In view of ease of maintenance and transferring of the substrates to the stage, and the like, it is normal practice to constitute the isolating means by assembling an isolating block and a plurality of isolating plates. The inside of the vacuum chamber and the inside of the isolated space are communicated with each other through the insulating block and through the clearance between the isolating plates. It is thus so arranged that the isolated space inside the vacuum chamber is evacuated accompanied by the evacuation in the vacuum chamber. In assembling the isolating block and the isolating plates together, the clearance between the isolating plates is set to a range of 2~3 mm so that, when RF (radio frequency) power is applied to the target, a plasma does not leak through the clearance between the respective isolating plates.

By the way, during film formation by sputtering of the target, sputtered particles get adhered also to the isolating plates, resulting in contamination. Therefore, the isolating plates are replaced regularly. In case the isolating plates are not assembled to keep the above-mentioned clearance, the pressure in the isolated space at the time of film formation, and also plasma density will consequently be changed. As a result, in-plane film thickness and film quality distribution will be changed.

As a solution, it is conceivable to dispose a gauge head of a pressure sensor in the isolated space. In this arrangement, however, film formation will be made also on the surface of the gauge head and, therefore, measurement of the pressure at a high accuracy will no longer be possible. Therefore, conventionally the pressure inside the vacuum chamber (i.e., the space on the outside of the isolating plates) was measured and, based on this measured pressure, the pressure inside the isolated space used to be estimated.

However, in case the clearance between the respective isolating plates varies and consequently the pressure in the isolated space varies, deviation occurs between the pressure in the isolated space that was estimated as in the conventional example and the actual pressure in the isolated space. Therefore, there is a problem in that discrimination cannot be made as to whether the atmosphere in the vacuum chamber is in a state fit for film formation.

PRIOR ART DOCUMENTS

Patent Documents

Patent Document 1: JP-2002-4042 A

SUMMARY OF THE INVENTION

Problems that the Invention is to Solve

In view of the above mentioned point, this invention has a problem of providing a sputtering apparatus in which discrimination can surely be made as to whether the atmosphere in the vacuum chamber is in a state fit for film formation or not, as well as of providing a method of discriminating the state.

Means of Solving the Problems

In order to solve the above problems, there is provided a method of discriminating a state of a sputtering apparatus in which, by sputtering a target, a film is formed on a substrate disposed to lie opposite to the target, the discrimination being made, prior to the film formation on the substrate, as to whether an atmosphere in the vacuum chamber is in a state fit for film formation. The method comprises: using, as the sputtering apparatus, one provided inside the vacuum chamber with an isolated space which is isolated from the vacuum chamber by an isolating means. The isolated space is for the target and the substrate to lie therein opposite to each other. The sputtering apparatus is so arranged that the isolated space is evacuated accompanied by the evacuation in the vacuum chamber. The method comprises a first discrimination step including: evacuating in advance the vacuum chamber to a predetermined set pressure; introducing therein a gas in this state to obtain a pressure in the isolated space at this time; let that pressure in the isolated space which is obtained in advance during film formation in a predetermined in-plane film thickness and film quality distribution be defined as a reference pressure, then comparing this reference pressure with the pressure in the isolated space, thereby discriminating the state of the sputtering apparatus.

According to this invention, by obtaining the pressure in the isolated space, and then comparing this obtained pressure with the reference pressure, discrimination can surely be made as to whether the atmosphere in the vacuum chamber is in a state fit for film formation or not. For example, in case the isolating means failed to be assembled into a predetermined position at the time of replacing the isolating means and, as a result, the pressure in the isolated space measured after replacement of the isolating means largely varies from the pressure before the replacement (reference pressure), there is a possibility that the in-plane film thickness and film quality distribution may vary. Discrimination will then be made that the state is not fit for film formation. In this case, the assembling position of the isolating means can be confirmed before carrying out dummy sputtering and film formation. This is advantageous in reducing the time for maintenance of the sputtering apparatus.

In this invention, the method preferably further comprises a second discrimination step including: measuring a pressure on the outside of the isolated space within the vacuum chamber; and discriminating the state of the sputtering apparatus based on a pressure difference between this measured pressure and that pressure in the isolated space which was obtained in advance. According to this arrangement, before carrying out dummy sputtering and film formation, it is possible to confirm the abnormality, and the like in the assembled position of the isolating means based on the pressure difference between the pressure in the isolated space and the pressure on the outside of the isolated space.

In this invention, the method preferably further comprises a third discrimination step including: measuring a change (or variation) in pressure per unit time in the isolated space when the gas is introduced; and discriminating the state of the sputtering apparatus based on this measured pressure in the isolated space. According to this arrangement, abnormality and the like in the assembled position can advantageously be confirmed before carrying out dummy sputtering and film formation.

In this invention, the method preferably further comprises a fourth discrimination step including: measuring a change in pressure per unit time on the outside of the isolated space within the vacuum chamber; and discriminating the state of the sputtering apparatus based on this measured change in pressure. According to this arrangement, the obtained pressure in the isolated space should be equal to the reference pressure and, in case the change in pressure per unit time on the outside of the isolated space within the vacuum chamber is larger, discrimination is made that the exhaust means of the sputtering apparatus has been deteriorated. Maintenance can thus be performed at a suitable timing.

Further, in order to solve the above-mentioned problems, the sputtering apparatus comprises: a vacuum chamber in which a target is detachably mounted in position; a stage which holds a substrate so as to lie opposite to the target in the vacuum chamber; an isolating means which defines an isolated space in which the target and the substrate lie opposite to each other and which is isolated from the inside of the vacuum chamber; and an evacuating means which evacuates the isolated space by evacuating the vacuum chamber. The isolating means comprises: an annular and grounded isolating block which is disposed around the stage; and an isolating plate which encloses the circumferences of the isolating block and the target so as to enclose the space between the target and the stage. The isolating block has formed therein at least one penetrating hole which penetrates in the thickness direction of the isolating block so that the front end of the hole faces the isolated space, and a vacuum gauge for measuring, through the penetrating hole, the pressure in the isolated space is disposed.

According to this invention, the pressure in the isolated space is measured through the penetrating hole in the isolating block. Therefore, the sputtered particles can be prevented from getting adhered to the gauge head of the vacuum gauge so as to form a film thereon. It follows that, by using the sputtering apparatus of this invention, the pressure in the isolated space can be measured. It can thus be possible to surely discriminate whether the atmosphere in the vacuum chamber is fit for film formation.

In this invention, preferably the isolating block has a plurality of the penetrating holes, a bent portion is formed in any of these penetrating holes, and the vacuum gauge is mounted through the bent portion. According to this arrangement, the sputtered particles having straight running property can further be prevented from getting adhered to the gauge head of the vacuum gauge and forming a film thereon. It can thus be possible to surely discriminate whether the atmosphere in the vacuum chamber is fit for film formation or not.

MODES FOR CARRYING OUT THE INVENTION

Figure 1:
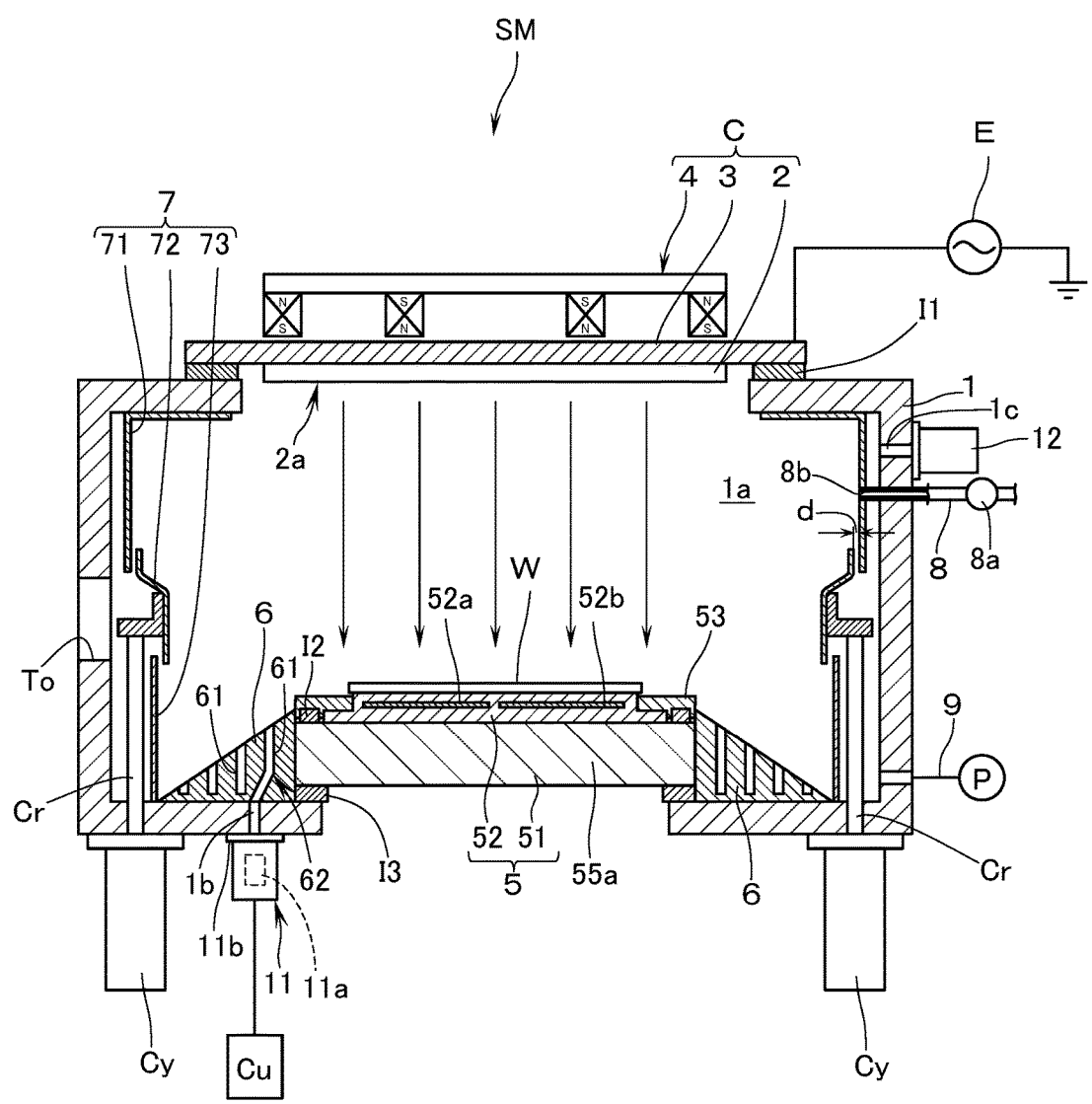
FIG. 1 is a schematic view of a sputtering apparatus according to an embodiment of this invention.

With reference to FIG. 1, the reference characters SM denote a sputtering apparatus according to an embodiment of this invention. This sputtering apparatus SM is provided with a vacuum chamber 1. At the ceiling portion of the vacuum chamber 1 there is detachably mounted a cathode unit C. In the following description, the direction looking toward the ceiling portion of the vacuum chamber 1 in FIG. 1 is defined to be "top or upper" and the direction looking toward the lower portion thereof is defined to be "bottom or lower."

The cathode unit C is constituted by a target 2, a backing plate 3, and a magnet unit 4. The target 2 is constituted by an insulating material such as aluminum oxide and the like to be appropriately selected depending on the composition of a thin film to be formed on the substrate W. Depending on the profile of the substrate W, the target 2 is formed into a circular shape as seen in plan view (i.e., from top toward bottom) by a known method. The backing plate 3 is bonded, by a bonding material such as indium, zinc and the like (not illustrated), to that upper surface of the target 2 which lies opposite to the sputtering surface 2a of the target 2. In a state of being bonded to this target 2, the backing plate 3 is mounted on an upper portion of the vacuum chamber 1 through an insulating body 11 in a state of being bonded to the target 2. The backing plate 3 has formed, in its inside portion, a coolant circulation passage (not illustrated) so that the target 2 can be cooled by circulating a coolant in the coolant circulation passage during film formation.

The target 2 is connected to a RF power supply E having a known construction and, at the time of sputtering, RF (AC) power of a predetermined frequency (e.g., 13.56 MHz) is applied between the grounding. The magnet unit 4 is of a known construction having a closed magnetic field or cusped magnetic field which generates a magnetic field in a space below the sputtering surface 2a of the target 2 and, at the time of sputtering, captures the electrons and the like ionized below the sputtering surface 2a so as to efficiently ionize the sputtered particles that have been scattered from the target 2. Therefore, detailed description of the magnetic unit is omitted here.

At the central bottom portion of the vacuum chamber 1 there is disposed a stage 5 in a manner to lie opposite to the target 2. The stage 5 is constituted by a metallic base 51 having, e.g., a cylindrical profile, and a chuck plate 52 bonded to an upper surface of the base 51. The chuck plate 52 has an outside diameter which is slightly smaller than that of the upper surface of the base 51, has buried therein electrodes 52a, 52b for electrostatic chucks, and is so arranged that voltage is applied from a chuck power source (not illustrated). The chuck plate 52 is detachably mounted on the upper surface of the base 51 by means of a ring-shaped deposition prevention plate 53. The deposition prevention plate 53 is mounted on the upper surface of the base 51 through an electrically insulating body 12. By the way, as to the structure of the electrostatic chuck, a known single-pole type, double-pole type and the like may be used. Therefore, detailed description thereof will be omitted here. The base 51 is supported by an insulating body 13 which is mounted in an airtight manner on an opening provided on a bottom surface of the vacuum chamber 1. The base 51 is thus electrically insulated from the grounded vacuum chamber 1 and is kept electrically independent from the grounded vacuum chamber 1, thereby electrically kept floating. As the material in which each of the electrically insulating bodies 11, 12, 13 is made, there is no particular limitation; there may be used fluororesin mixed with glass (polytetrafluoroethylene), epoxy resin (mixed with glass) may be used.

The sputtering apparatus SM has an isolating means which defines an isolated space 1a that is isolated from the inside of the vacuum chamber 1 and in which the target 2 and the substrate W face each other, the isolating means comprising an annular and grounded isolating block 6 and a plurality of isolating plates 71, 72, 73. The isolating block 6 is disposed on that bottom surface of the vacuum chamber 1 which is around the stage 5, and is formed so as to be inclined from the inner peripheral edge portion of the isolating block 6 downward radially outward. The isolating plates 71, 72, 72 are disposed in the up and down positional relationship so as to enclose the space between the target 2 and the stage 5 by enclosing the surrounding of the isolating block 6 and the target 2. This isolating block 6 and the isolating plates 71, 72, 73 also serve the purpose of deposition prevention plates which prevent the sputtered particles from getting adhered to the inner wall surfaces of the vacuum chamber 1. To the outside surfaces of the isolating plates 72 there are respectively connected driving shafts Cr of cylinders Cy which are respectively provided by penetrating through the bottom surface of the vacuum chamber 1. By means of the cylinders Cy the isolating plates 72 are freely movable between a lowered position as shown in FIG. 1 and a lifted position on the side of the isolating plate 71. By moving the isolating plate 72 to the lifted position, clearance will be formed between the isolating plate 72 and the isolating plate 73 so that a substrate W can be transported into, and out of, the stage 5 via a through-hole To, for transporting purpose, which is opened and closed by a gate valve (not illustrated). In assembling the isolating plates 71, 72, 73, the clearance d between each of them is set to a range of 2~3 mm so that a plasma does not leak through the respective clearances d when RF power is applied to the target 2.

The side wall of the vacuum chamber 1 has connected thereto a gas pipe 8 as the gas introducing means to introduce a sputtering gas into the isolated space 1a. This gas pipe 8 is communicated with a gas source (not illustrated) through a mass flow controller 8a. The sputtering gas includes not only a rare gas such as argon gas and the like which is introduced at the time of forming the plasma in the isolated space 1a, but also a reactive gas such as oxygen gas and nitrogen gas. The side wall surface of the vacuum chamber 1 has also connected thereto an exhaust pipe 9 which is communicated with an exhaust means P which is constituted by a turbo molecular pump, a rotary pump, and the like. It is so arranged that, by exhausting the inside of the vacuum chamber 1 at a uniform speed by the exhaust means P, the isolated space 1a can be evacuated.

The above-mentioned sputtering apparatus SM has a known control means Cu provided with a microcomputer, sequencer and the like, and is arranged to perform not only the method of discriminating the state which is to be described hereinafter, but is also arranged to perform an overall control of the operation of the mass flow controller 8a, the operation of the exhaust means P, the operation of the RF power source E, the operation of the cylinders Cy, and the like. Description will now be made of a sputtering method by using the above-mentioned sputtering apparatus SM, by taking an example of forming an alumina film.

By means of the cylinder Cy the isolating plates 72 are moved to the lifted position, and by using a transfer robot (not illustrated) the substrate W is transferred via the through-hole To onto the stage 5. By applying a predetermined voltage to the electrodes 52a, 52b for the electrostatic chucks, the substrate W is electrostatically sucked. After having retrieved the transfer robot, the isolating plates 72 are moved by the cylinders Cy to the lowered position. From an introduction inlet 8b of the gas pipe 8 argon gas, as the sputtering gas, is introduced into the isolated space 1a at a predetermined flow rate. A predetermined RF power (e.g., 13.56 MHz, 1~5 kW) is applied from the RF power source E to the target 2. According to these operations, the plasma is formed in the isolated space 1a, and the sputtered particles scattered as a result of sputtering of the sputtering surface 2a of the target 2 will get adhered to, and deposited on, the substrate W, whereby an insulation film of alumina and the like are formed.

By the way, during film formation by sputtering, the sputtered particles from the target 2 will get adhered not only to the surface of the substrate W but also to the isolating plates 71, 72, 73. Since this adhesion will be the cause for contamination, the isolating plates 71, 72, 73 are periodically replaced. At this time, in case the isolating plates 71, 72, 73 are not assembled in a manner to maintain the above-mentioned clearance d, the pressure and consequently the plasma density in the isolated space 1a at the time of film formation that is resumed after replacement of the isolating plates will vary and the in-plane film thickness and film quality distribution will be changed.

According to this embodiment, the isolating block 6 has formed therein a plurality of penetrating holes 61 which penetrate the thickness direction of the isolating block so that the front ends of the holes face the isolated space 1a. Any one of these penetrating holes 61 has formed therein a bent portion 62 which is bent on the way. A through-hole 1b which is in communication with the penetrating hole 61 having formed therein the bent portion 62 is formed through the bottom wall of the vacuum chamber 1. A flange 11b for a vacuum gauge 11 is mounted in airtight manner on the through-hole 1b. By means of this vacuum gauge 11, the pressure in the isolated space 1a can be measured through the bent portion 62. Since the sputtered particles scattered from the target 2 at the time of film formation have straight running property, the sputtered particles that may have been incident into the penetrating hole 61 cannot enter beyond the bent portions 62. Therefore, the sputtered particles will not get adhered to a gauge head 11a of the vacuum gauge. Description will now be made of the method of discriminating the state of the sputtering apparatus with reference to an example to be carried out after replacement of the isolating plates 71, 72, 73.

After having assembled the cleaned isolating plates 71, 72, 73 in position, the vacuum chamber 1 is evacuated by the vacuum pump P to thereby evacuate the isolated space 1a. When the isolated space 1a reaches a predetermined pressure ($1 \times 10^{-4}$ Torr), argon gas, for example, is introduced from the gas pipe 8 in an amount of 200 sccm. At this time, the inside of the isolated space 1a and the inside of the vacuum chamber 1 are in communication with each other through the clearance d between the isolated plates 71, 72, 73. Therefore, a pressure difference depending on the above-mentioned clearance (conductance) d will be generated between the two. In other words, the pressure in the isolated space 1a will vary relative to the flow rate of the argon gas depending on the above-mentioned clearance d. In case the clearance d is smaller than the predetermined value (design value) due to poor or inadequate assembling of the isolated plates 71, 72, 73, the pressure in the isolated space will be higher, on one hand. On the other hand, if the clearance d is larger than the predetermined value, the pressure in the isolated space 1a will be lowered. In this manner, when the clearance d changes, the pressure in the isolated space 1a at the time of film formation and, as a consequence, the plasma density will be changed, whereby film formation will no longer be performed with good in-plane film thickness and film quality distribution.

In this embodiment, after the lapse of a predetermined time after starting introduction of the argon gas, the pressure in the isolated space 1a that is measured by the vacuum gauge 11 (hereinafter also referred to as "measured pressure") is obtained by the above-mentioned control means Cu. In addition, a pressure in the isolated space 1a when film formation was performed at predetermined (favorable) in-plane film thickness and film quality distribution is obtained in advance as a reference pressure. Then, the obtained measured pressure and the pressure (reference pressure) when film formation was made at good in-plane film thickness and film quality distribution are compared with each other. If the measured pressure is equivalent to the reference pressure (i.e., the difference between the two is within a predetermined range), discrimination is made that the atmosphere in the vacuum chamber 1, i.e., the atmosphere in the isolated space 1a is in a state fit for film formation (first discrimination step). In this case, the processing returns to the above-mentioned film formation after carrying out the known dummy sputtering. On the other hand, in case the difference between the measured pressure and the reference pressure exceeds a predetermined range, discrimination is made that the atmosphere in the isolated space 1a is in a state not fit for film formation. In this case, without carrying out dummy sputtering, maintenance and the like is performed such as confirming the assembling of the isolating plates 71, 72, 73 in position. According to this arrangement, the abnormality of requiring a long time before finishing the maintenance can be prevented from taking place, the abnormality being that, due to poor assembling of the isolating plates 71, 72, 73, good in-plane film thickness and film quality distribution can no longer be made, is disclosed during the film formation after dummy sputtering. As a result, since the maintenance can be performed before dummy sputtering, the time for maintenance can advantageously be shortened.

Description has so far been made of an embodiment of this invention, but this invention shall not be limited to the above. In the above-mentioned embodiment, description has been made of a case in which three isolation plates 71, 72, 73 are provided. The number of the isolation plates, however, needs not be limited to the above, but may be provided with a plurality of pieces so as to keep a clearance d between the adjoining isolation plates.

Further, as shown in FIG. 1, the following arrangement may be made, i.e., the side wall of the vacuum chamber 1 is provided with a through-hole 1c, and a second vacuum gauge 12 which is in communication with this through-hole 1c is disposed therein so that the pressure on the outside of the isolated space 1a within the vacuum chamber 1 can be measured. Then, measurement is made also of the pressure on the outside of the isolated space within the vacuum chamber 1 relative to the flow rate of the argon gas. Based on the pressure difference between this measured pressure and the pressure in the isolated space 1a, the state of the sputtering apparatus SM may be discriminated (second discrimination step). In this case, while the pressure in the isolated space 1a is equivalent to the pressure that was measured in the previous time (i.e., the measured pressure and the reference pressure are equivalent to each other), if the pressure on the outside of the isolated space 1a within the vacuum chamber 1 is higher than the pressure that was measured in the previous time, the pressure difference will become larger. Then, discrimination is made, for example, that the exhaust means P has been deteriorated. The maintenance can thus be advantageously performed at a suitable timing.

Furthermore, the rate of change in pressure in the isolated space 1a per unit time while the sputtering gas is being introduced, or the rate of change in the pressure on the outside of the isolated space 1a within the vacuum chamber 1 may be measured to thereby discriminate the state of the sputtering apparatus based on this measured rate of change (third and fourth discrimination steps). It is to be noted here that, unless the isolating plates 71, 72, 73 are assembled so as to keep the above-mentioned clearance d, the conductance between the inside of the isolated space 1a and the outside of the isolated space 1a will vary. Such being the case, it is possible to confirm, out of these rates of change, the abnormality and the like in the assembling position of the isolating plates 71, 72, 73.

In the above-mentioned embodiment, description was made of an example in which the pressure in the isolated space 1a was measured by means of the vacuum gauge 11 through the bent portion 62. However, in case the sputtered particles get adhered to the inner wall of the penetrating holes 61 in the isolating block 6 and, as a consequence, the sputtered particles will not reach the vacuum gauge 11, the bent portion 62 needs not be formed in the penetrating hole 61. In such a case, the pressure in the isolated space 1a will be measured through the penetrating hole 61. In addition, in the above-mentioned embodiment, a plurality of penetrating holes 61 is provided in the isolating block 6. It is, however, not always necessary to provide the penetrating holes 61 in a plurality of numbers, but only one penetrating hole 61 in fluid flow communication with the vacuum gauge 11 will be enough.

Next, in order to confirm the effects of the above-mentioned arrangement, the following experiments were carried out by using the RF sputtering apparatus SM as shown in FIG. 1. In this experiment, the isolating plates 71, 72, 73 were assembled to appropriate positions (at this time the clearance d was 3 mm), and this state was defined as the first state. In this first state, after having evacuated the isolated space 1a down to $1 \times 10^{-4}$ Torr by evacuating the vacuum chamber 1, argon gas was introduced in the amount of 200 sccm. The pressure in the isolated space 1a after the lapse of a predetermined time (5 sec) after starting the introduction of argon gas (corresponding to "reference pressure"), and the pressure in the vacuum chamber 1 were respectively measured by the vacuum gauges 11, 12. As a result, they were found to be $2.1 \times 10^{-2}$ Torr, $1.4 \times 10^{-2}$ Torr (the pressure difference at this time was $0.7 \times 10^{-2}$ Torr). In addition, in this first state RF power source E of 13.56 MHz was applied to the target 2 at 3 kW to thereby form an aluminum oxide film on the surface of a silicon substrate W that was held by the stage 5. The in-plane film thickness distribution, thus measured, was found to be 1.46%.

Figure 2:
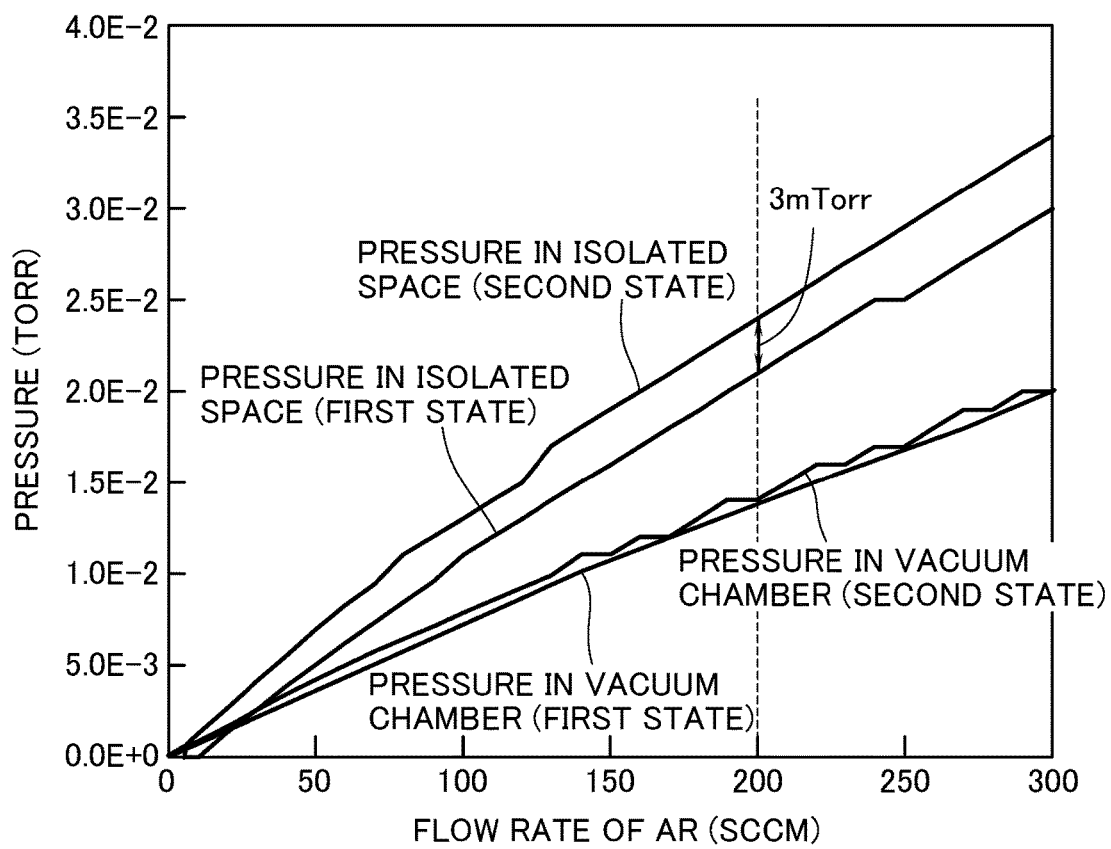
FIG. 2 is a graph showing the results of experiments to confirm the effects of this invention.

Then, the isolating plates 71, 72, 73 were intentionally deviated in position so that the clearance became as small as 1.5 mm, and this state was defined as a second state. In this second state argon gas was introduced by 200 sccm in the similar manner as in the above-mentioned first state. The pressure in the isolated space 1a after the lapse of a predetermined time (5 sec) after having started the introduction of argon gas and the pressure in the vacuum chamber 1 were respectively measured by the vacuum gauges 11, 12. As a result, they were found to be $2.4 \times 10^{-2}$ Torr, $1.4 \times 10^{-2}$ Torr (the pressure difference at this time was $1 \times 10^{-2}$ Torr). In the same manner as in the above-mentioned first state, aluminum oxide film was formed on the surface of the silicon substrate W. The in-plane film thickness distribution measured was found to be 1.81%. Furthermore, in each of the first state and the second state, the flow rate of the argon gas was varied between 50~300 sccm. As a result of measurement in the same manner as mentioned above, the relationship as shown in FIG. 2 was obtained.

From the above, it has been confirmed that, while the pressure in the vacuum chamber 1 was equivalent to each other in the first state and the second state, the pressure in the isolated space 1a was different between the first state and the second state by about 3 m Torr. In addition, it has been confirmed that, when the clearance d changed, the pressure in the isolated space 1a varied, with the result that the in-plane film thickness distribution varied. It can therefore be seen that, by measuring the pressure in the isolated space 1a by means of the vacuum gauge 11, discrimination can be made as to whether the atmosphere in the vacuum chamber 1 and in the isolated space 1a is in a state fit for film formation or not. In addition, it has also been found that the discrimination can also be made by the differential pressure between the pressure in the isolated space 1a and the pressure on the outside of the isolated space 1a within the vacuum chamber 1.

Explanation of Reference Characters

| | |
|---|---|
| SM | sputtering apparatus   W  substrate |
| 1 | vacuum chamber   1a  isolated space |
| 2 | target   5  stage |
| 6 | isolation block (isolating means) |
| 61 | penetrating hole |
| 62 | bent portion |
| 71, 72, 73 | isolation plate (isolating means) |
| 11 | vacuum gauge |

The invention claimed is:

1. A method of discriminating a state of a sputtering apparatus in which, by sputtering a target, a film is formed on a substrate disposed to lie opposite to the target, the discrimination being made, prior to the film formation on the substrate, as to whether an atmosphere in a vacuum chamber is in a state fit for film formation, comprising:

using, as the sputtering apparatus, one provided inside the vacuum chamber with an isolated space which is isolated from the vacuum chamber by an isolating means, the isolated space being for the target and the substrate to lie therein opposite to each other, the sputtering apparatus being so arranged that the isolated space is evacuated accompanied by the evacuation in the vacuum chamber, the isolating means including:

an annular and grounded isolating block which is disposed around a stage located under the substrate, an isolating plate which encloses circumferences of the isolating block and the target so as to enclose the isolated space between the target and the stage, wherein the isolating block has formed therein at least one penetrating hole which penetrates in a thickness direction of the isolating block so that a front end of the at least one penetrating hole faces the isolated space, and wherein any one of the at least one penetrating hole has formed therein a bent portion, and wherein a vacuum gauge is mounted in the bent portion to measure a pressure in the isolated space;

a first discrimination step including: evacuating in advance the vacuum chamber to a predetermined set pressure; introducing therein a gas in this state, measuring the pressure in the isolated space at this time by the vacuum gauge through the bent portion; let that pressure in the isolated space which is obtained in advance during film formation in a predetermined in-plane film thickness and film quality distribution be defined as a reference pressure, then comparing this reference pressure with the pressure measured in the isolated space, thereby discriminating the state of the sputtering apparatus.

2. The method of discriminating a state of a sputtering apparatus according to claim 1, further comprising a second discrimination step including: measuring a pressure on an outside of the isolated space within the vacuum chamber; and discriminating the state of the sputtering apparatus based on a pressure difference between this measured pressure and that pressure in the isolated space which was obtained in advance.

3. The method of discriminating a state of a sputtering apparatus according to claim 1, further comprising a third discrimination step including: measuring a change in pressure per unit time in the isolated space when the gas is introduced; and discriminating the state of the sputtering apparatus based on this change in pressure in the isolated space.

4. The method of discriminating a state of a sputtering apparatus according to claim 1, further comprising a fourth discrimination step including: measuring a change in pressure per unit time on the outside of the isolated space within the vacuum chamber; and discriminating the state of the sputtering apparatus based on this measured change.

5. A sputtering apparatus comprising:

a vacuum chamber in which a target is detachably mounted in position;

a stage which holds a substrate so as to lie opposite to the target in the vacuum chamber;

an isolating means which defines an isolated space in which the target and the substrate lie opposite to each other and which is isolated from an inside of the vacuum chamber; and an evacuating means which evacuates the isolated space by evacuating the vacuum chamber;

wherein the isolating means comprises: an annular and grounded isolating block which is disposed around the stage; and an isolating plate which encloses the circumference of the isolating block and the target so as to enclose the space between the target and the stage, wherein the isolating block has formed therein at least one penetrating hole which penetrates in a thickness direction of the isolating block so that a front end of the at least one penetrating hole faces the isolated space, wherein any one of the at least one penetrating hole has formed therein a bent portion, wherein a vacuum gauge is mounted in the bent portion to measure a pressure in the isolated space, and, wherein a control means, which discriminates a state of the puttering apparatus by comparing a reference pressure with the pressure measured in the isolated space, is connected to the vacuum gauge.

\* \* \* \* \*